United States Patent [19]

Chow

[11] 4,123,711
[45] Oct. 31, 1978

[54] SYNCHRONIZED COMPRESSOR AND EXPANDER VOICE PROCESSING SYSTEM FOR RADIO TELEPHONE

[75] Inventor: Sherman M. Chow, Bells Corners, Canada

[73] Assignee: Canadian Patents and Development Limited, Ottawa, Canada

[21] Appl. No.: 762,435

[22] Filed: Jan. 24, 1977

[51] Int. Cl.$^2$ .......................... H04B 1/64; H03G 7/00
[52] U.S. Cl. ....................................... 325/62; 325/65; 179/1 SC; 330/254; 333/14
[58] Field of Search ...................... 325/62, 68, 101, 46, 325/397; 179/1 VL, 1 P, 15 BT, 1 SC, 1 SA; 333/14, 17 L; 330/29, 144

[56] References Cited

U.S. PATENT DOCUMENTS

| | | | |
|---|---|---|---|
| 2,959,641 | 11/1960 | Hufnagel | 333/14 |
| 3,193,775 | 7/1965 | Herrerd et al. | 325/62 |
| 3,458,815 | 7/1969 | Becker | 325/62 |
| 3,681,756 | 8/1972 | Burkhard et al. | 179/1 SA |
| 3,732,371 | 5/1973 | Burwen | 333/14 |
| 3,969,680 | 7/1976 | Wermuth | 179/1 P |
| 4,001,505 | 1/1977 | Araseki et al. | 179/1 SC |

FOREIGN PATENT DOCUMENTS

| | | | |
|---|---|---|---|
| 2,340,097 | 12/1973 | Fed. Rep. of Germany | 333/14 |
| 1,243,974 | 8/1971 | United Kingdom | 333/14 |

OTHER PUBLICATIONS

A Monolithic Analog Compandor, Craig. Todd., IEEE Journal of Solid-State Ckt., vol. SC-11, No. 6, Dec., 1976.

Primary Examiner—Robert L. Griffin
Assistant Examiner—Tommy P. Chin
Attorney, Agent, or Firm—Edward Rymek

[57] ABSTRACT

The voice processing system for radio telephone consists of a compressor in the transmitter and an expander in the receiver. The compressor divides the input voice signal into syllabic groups and applies a gain to each syllabic group depending on the peak amplitude of the signal of the respective group, resulting in a reduction or compression of the dynamic range of the voice. The expander on the other hand increases or expands the dynamic range of the signal restoring the voice to its original form. The compressor and expander are synchronized such that the amount of expansion or instantaneous gain in the receiver is exactly the reciprocal of the amount of compression in the transmitter, i.e. when the gain of the compressor is N, the gain of the expander is 1/N. In this way the total system gain is always unity and is therefore transparent to voice and other analog signals passing through it. A porton of the voice frequency band is pre-empted to carry a digital signal to synchronize the compressor to the expander. This band designated as the control channel is located between 2500 to 2700 Hz and is used to carry binary frequency shift keyed (FSK) data stream which defines the instantaneous gain of the expander denoted by N. The band between 300–2500 Hz is used to carry the compressed voice. The effect of noise encountered in the transmission path is reduced because the soft syllables are amplified to the same amplitude as the loud syllables thus achieving an improved signal-to-noise ratio.

11 Claims, 6 Drawing Figures

ANALOG INPUT (A)
COMPRESSOR OUTPUT (B)
EXPANDER INPUT (C)
EXPANDER OUTPUT (D)

COMPRESSOR OUTPUT (B)
CONTROL CHANNEL (E)

SYNCHRONIZED COMPRESSOR AND EXPANDER VOICE PROCESSING SYSTEM FOR RADIO TELEPHONE

BACKGROUND OF THE INVENTION

This invention is directed to a voice processing system for amplitude modulated radio telephones and in particular to a system having a compressor attached to the transmitter and an expander attached to the receiver, the compressor and the expander being synchronized by a digital signal transmitted along with the voice.

HF radio telephones are used for communication beyond the line-of-sight. Many ships and aircraft are dependent upon HF radio telephones for vital communications, however voice traffic on HF radio telephones is often hampered by high ambient voice and by fading. In addition, HF radio telephones are deployed in remote sparsely populated regions in which satellite and troposcatter systems cannot be economically supported.

The principle of this invention is related to a system called "Lincompex" described in the publication by Carter et al "Lincompex": A system for Improving High Frequency Radio Circuits — British Communications Electronics — August 1965, Vol. 12, No. 8, Pages 494-497. Lincompex was developed by the British Post Office to improve the performance of radio telephones when fading and noise is encountered. Although Lincompex has proven to be successful in long range international radio telephone circuits, radio telephone users with limited means have not been able to take advantage of it for the following reasons: The Lincompex was developed over a decade ago and is expensive compared to a standard commercial radio telephone. In addition, the Lincompex requires a frequency source with stability which is significantly better than those normally supplied to inexpensive radio telephones. The capacity of the channel needed to carry Lincompex synchronization information is large since the gain can be anywhere within a 60 db range and gain change can occur at any time. When this channel fails in a noisy environment, synchronization is lost and the Lincompex system becomes inoperative.

When speech is being transmitted the peak to average power of a standard amplitude modulated SSB radio telephone is about 14.5 db. This figure is obtained when saturation of the power stage is allowed about 1% of the time. This above number implies that the maximum power capability of the transmitter is rarely fully utilized when voice is being transmitted. When noise is encountered, the loud syllables of the voice can be understood but the soft syllables are masked, degrading the intelligibility of transmitted voice.

SUMMARY OF THE INVENTION

It is therefore an object of this invention to provide a voice processing system for radio telephone which can increase the signal-to-noise ratio of the received voice without increasing the peak power requirement of the transmitter.

It is another object of this invention to provide a system having more effective automatic gain control (AGC) capability for amplitude modulated radio telephones.

It is a further object of this invention to provide an amplitude modulated system in which the receiver frequency is stabilized by phase locking the demodulating oscillator to the frequency reference of the transmitter, resulting in a more intelligible and more natural sounding voice.

It is another object of this invention to provide a voice processing system which can be fitted to existing radio telephones.

It is a further object of this invention to provide a voice processing system for radio telephones which is reliable and yet low in cost.

These and other objects are achieved in a voice processing system for an amplitude modulating radio telephone which includes a compressor for connection in the transmitter and an expander for connection in the receiver. In the compressor, the input signal is divided into sequential syllabic groups of fixed length and the amplitude of each syllabic group is adjusted by a gain determined by the peak amplitude of the signal in each corresponding syllabic group. The compressor further provides a control signal representative of the gain adjustments which is transmitted in conjunction and in synchronism with the adjusted voice signal. In the expander, the received adjusted signal is divided into similar sequential syllabic groups and the amplitude of each syllabic group is adjusted by a gain determined by the received control signal restoring the received adjusted signal to the original input voice signal.

The compressor and expander may include analog to digital converters which sample the input signal at a rate P and provide a series of binary numbers grouped into sequential syllabic groups having M consecutive binary numbers. In the compressor, the largest binary number in a group is detected and then each number in the group is multipled by a factor N as determined by that number. In one embodiment $N = 2^Y$ where Y is the number of "0"s preceeding a "1" in the largest number and therefore could be equal to 0, 1, 2, 3, ... 7. A control signal representing Y is generated and transmitted to the receiver in synchronism with the adjusted voice signal reconverted to an analog signal. This control signal is used in the receiver to multiply each binary number in a corresponding syllabic group by the reciprocal 1/N, after which the binary numbers are reconverted to an output analog signal.

DESCRIPTION OF THE PREFERRED EMBODIMENT

Figure 1:
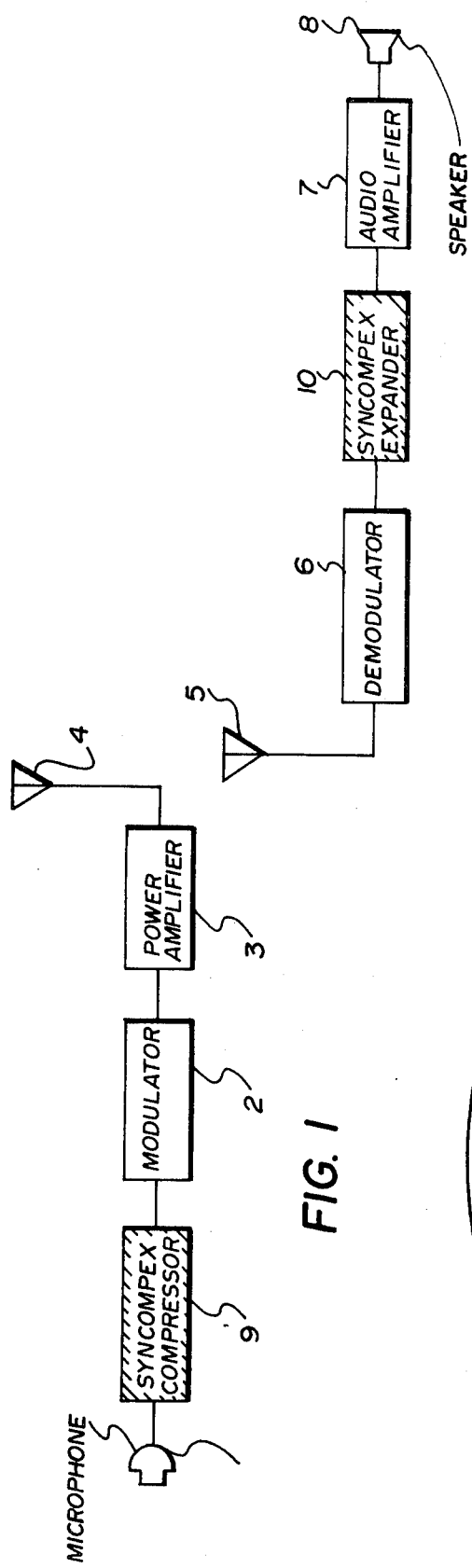
FIG. 1 illustrates a block diagram of a radio telephone having a syncompex voice processing system.

FIG. 1 illustrates a block diagram of radio telephone in accordance with the present invention. As in standard radio telephones, the transmitting section of the transceiver includes a microphone 1 to pick up the voice of the operator, a modulator 2 to modulate the voice signal into an amplitude modulated signal such as a single sideband modulated signal, and a power amplifier 3 to amplify the modulated voice signal to be transmitted by antenna 4. The receiver section of the transceiver includes an antenna 5 for receiving a signal from a distant transmitter, a demodulator 6 to demodulate the received modulated voice signal, an amplifier for amplifying the demodulated voice signal and a speaker 8 to convert the voice signal to sound. However, in accordance with the present invention, the transmitter and receiver sections further include a compressor 9 and an expander 10 respectively which consist of variable gain audio amplifiers that operate on the voice signals in the transceiver. The function of the compressor 9 is to reduce the dynamic range of the voice. This is done by converting the analog input signal into a series of binary numbers grouped or divided into sequential syllabic groups, adjusting the binary numbers for each syllabic group by a factor determined by the largest binary number in each of the respective groups and then reconverting the binary numbers back to an output analog signal. The function of the expander 10 is to perform the exact opposite function, i.e. increasing or expanding the dynamic range, by converting the received signal to a series of binary numbers grouped or divided into sequential syllabic groups, readjusting the numbers by the same factor and reconverting the binary numbers to an analog signal, thus restoring the voice to its original form. In addition, the compressor 9 and the expander 10 must be synchronized and the amount of expansion or instantaneous gain in the receiver is exactly the reciprocal of the amount of compression in the transmitter, i.e. when the gain of the compressor 9 is N, the gain of the expander 10 is 1/N. In this way, the total system gain of the synchronized compressor 9 and expander 10 or syncompex is always unity and is therefore transparent to voice and other analog signals passing through it, while at the same time each syllable in the voice signal is transmitted at an approximately constant amplitude and in this way the soft syllables can be heard as well as the loud.

Figure 2:
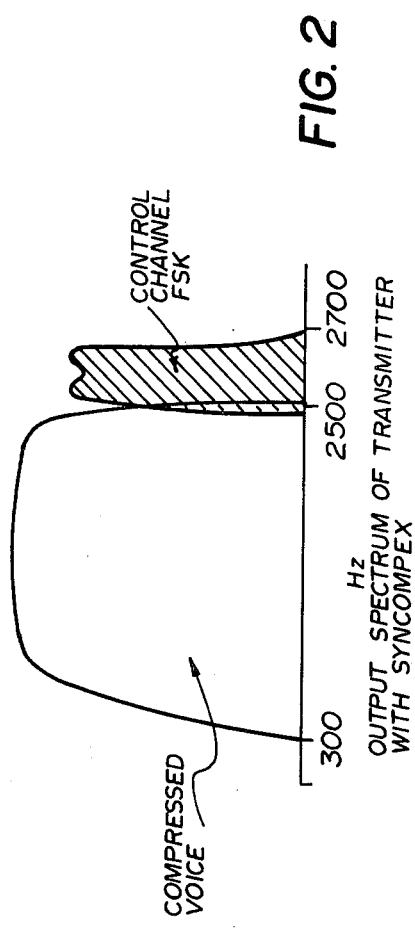
FIG. 2 illustrates the frequency spectrum of the voice channel and the control channel.

To synchronize the compressor 9 to the expander 10, a portion of the voice frequency band is pre-empted to carry a digital signal. This band designated as the control channel in FIG. 2, is located between 2500 to 2700 Hz in the example of FIG. 2. The control channel is used to carry a digital data stream to the expander which sequentially represents the instantaneous gain applied to sequential syllabic groups in the compressor.

The syncompex system is particularly advantageous when operating in an amplitude modulated system such as a single-sideband-suppressed carrier (SSB-SC) communication system. These advantages may be important, if for example the SSB-SC system is an integral part of a larger communication system.

Most inexpensive SSB-SC transceivers have a front panel control called a "clarifier" which adjusts the frequency of the local oscillator used for demodulation of the received signal. This control is necessary because good quality voice requires that the transmit and receive frequencies be different by a very small amount. Since oscillators with the capability of maintaining this degree of stability are usually beyond the price range of most commercial sets, a "clarifier" control must be used. Usually the operator tunes the "clarifier" which controls the frequency until the voice "sounds natural". Misadjustment is said to cause the voice to sound "brassy" or "gutteral." Under this circumstance, the voice quality is determined by the skill and patience of the operator. Moreover, signals such as "touch-tone" cannot be passed satisfactorily over a system of this type because even the most skillful and dedicated operator cannot tune the "clarifier" with the necessary precision.

In the syncompex system, the control channel is always transmitted when a voice transmission is in progress. If the digital modulator used for the control channel is phase coherent, a continuous carrier can be extracted to provide a frequency reference signal to which the receive local oscillator can be phase locked. With the AFC feature of the syncompex system implemented in a system, the operator will not be required to make adjustments to the "clarifier." More important, misadjustments of the "clarifier" by the operator is virtually impossible.

Signals propagating in the HF band often suffer from amplitude fluctuations. This phenomenon is called fading and is a factor in the general poor quality of voice usually associated with HF radio telephony. In most radios there is a circuit designed to counteract fading in the receiver front end. This anti-fading circuit is usually an AGC amplifier whose gain is controlled by demodulated voice. The energy in the demodulated voice is usually detected and is integrated over a period selected by the designer of the receiver. The output of the integrator is fed back to control the front end gain to maintain a constant average level at the integrator.

This type of arrangement is usually not satisfactory for single sideband suppressed carrier modulation since there is no amplitude signal reference for that system when the speaker pauses during speech. During these periods the gain of the receiver is increased, the background noise is emphasized and becomes pronounced. The control channel of the Syncompex, being a constant level signal, can provide a more accurate control signal for front end AGC to counteract fading and continues to be effective during pauses in speech.

Figure 3:
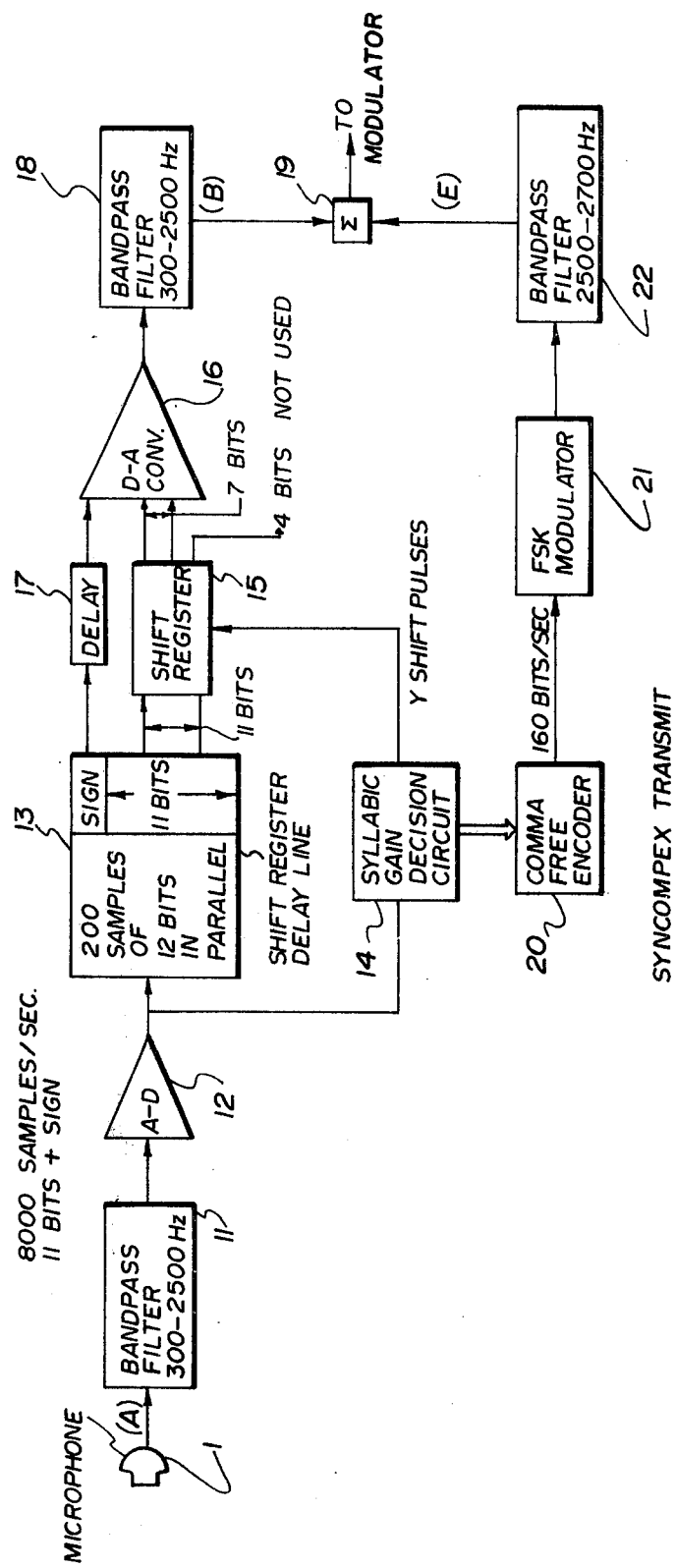
FIG. 3 illustrates a compressor in accordance with the present invention.
Figure 4:
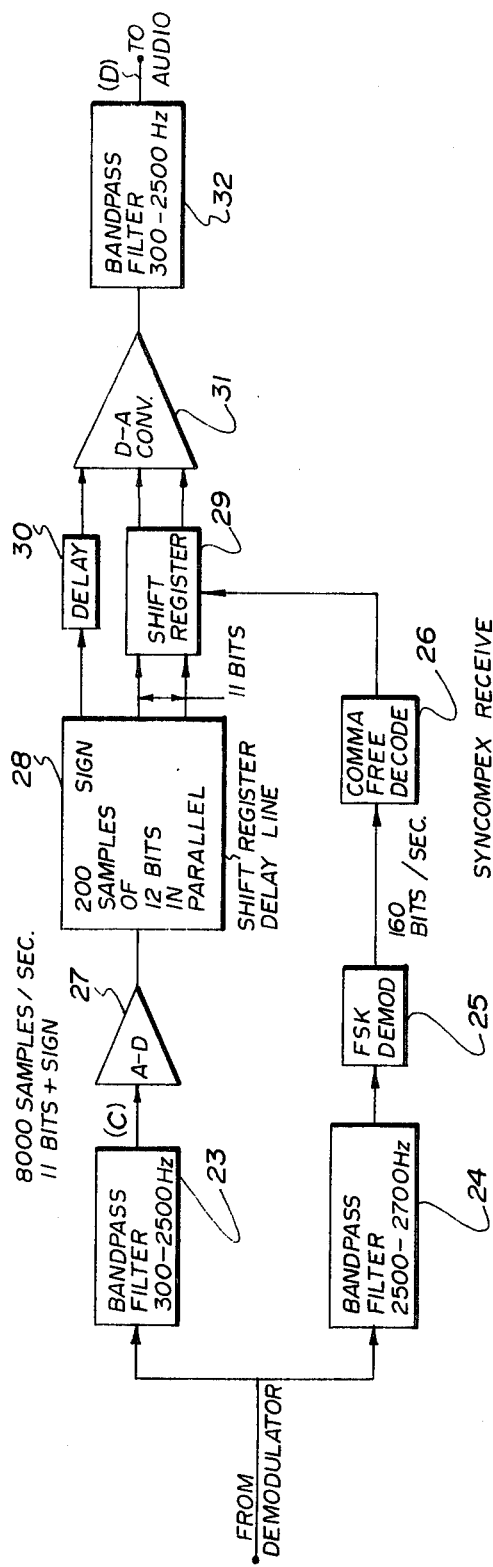
FIG. 4 illustrates an expander in accordance with the present invention.

FIG. 1 illustrates the location of the Syncompex in the radio telephone system. The detailed description of one embodiment of the Syncompex system in accordance with this invention is shown in FIGS. 3 and 4. For simplicity of description, the Syncompex voice processing system is shown in FIGS. 3 and 4 as two separate sub-systems. In a practical transceiver, some of the circuits may be shared since the transceiver would be either in the transmit or in the receive mode.

Figure 5A:
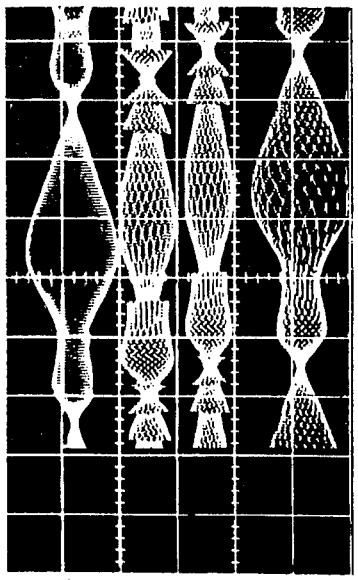
FIGS. 5a and 5b illustrate the analog waveforms at selected points in the compressor and expander.

At the transmitter end, illustrated in FIG. 3, the audio signal received from the microphone 1, and shown in FIG. 5(a) as signal (A), is filtered by a bandpass filter 11 as the input of the analog to digital converter 12. The filter 11 in this embodiment has a bandpass between 300–2500 Hz and serves to eliminate "aliasing" problems in the A-D converter 12. The output of the A-D converter 12 is a series of binary numbers representing the amplitudes of the sampled signal. The binary numbers may be of any desired length, however a 12 bit binary numbers (11 bits and sign) has been found to be sufficient. The A-D converter 12 output is coupled to a parallel shift register delay line 13 which stores a number M of consecutive samples, the number of positions in the delay line 13 determines the length of a syllable or the number M of samples in a syllable. At a sampling rate P of 8000 samples per second, a syllable length M of 200 has been found to be adequate.

The A-D converter 12 output is also coupled to a syllabic gain decision circuit 14. The function of the decision circuit 14 is to determine the amount of gain to be applied to a respective syllable. It is equivalent to finding a suitable value of gain N such that the syllable is transmitted as loud as possible without saturating the output power amplifier. The gain N is obtained by determining the number Y of "0"s which precede a "1" in the largest binary number of the 200 binary numbers in the syllable. This number of "0"s exclude the sign bit. For example, for the binary number +00010110101 the number Y of leading "0"s is 3. If this sample is the largest in the syllable of 200 samples, the compressor gain is set to N = $2^3$ for the entire syllable.

A second parallel shift register 15 is coupled to delay line 13 and receives in sequence each binary number of 11 bits of the syllable in question. The shift register is also coupled to the decision circuit 14 such that as each binary numbers of a syllable is received from the shift register 13, the number Y operates on shift register 15 to shift the binary number in the direction of the most significant digit by Y positions. Thus, taking the example above, each binary number in the syllable will be shifted 3 places, i.e. +00010110101 becomes +10110101000. Shift register 15, under the control of gain decision circuit 14, in effect multiplies the amplitude of every sample or binary number in a syllable by $2^Y$, and affects syllabic compression.

The shift register 15 output is coupled to a digital to analog converter 16 which also receives the sign bits and converts the shifted binary numbers to an analog waveform. The sign bit is transmitted to D-A converter 16 from delay line 13 through a further delay circuit 17 such that the sign bit is synchronized with its corresponding binary number. In the present embodiment, only the seven most significant bits of each binary number form shift register 15 are used to reconstruct the analog waveform, as this is found to be sufficient without causing undue distortion in the waveform.

Figure 5B:
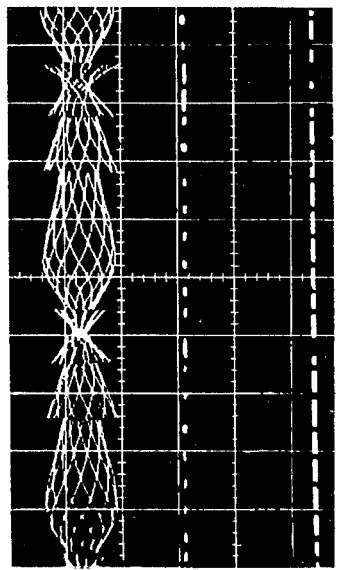

The D-A converter 16 output is coupled to a second 300-2500 kHz bandpass filter 18 whose output, a sample of which is shown in FIGS. 5(a) or 5(b) as signal (B), is coupled to a combining circuit 19.

Each syllabic duration is M/P or in this particular embodiment 200/8000 = 1/40 second. During this period one value of N = $2^Y$ must be transmitted to control the expander. For reasons of circuit simplicity the values of compression gain are restricted to N = $2^Y$, where Y = 0, 1, 2, 3, 4, 5, 6, or 7. In the present embodiment, the value of Y is encoded as a 4 bit binary number by an encoder 20 and transferred serially at 160 bits per second to a frequency shift keyed (FSK) modulator 21 to produce the control signal (E) shown in FIG. 5(b). The FSK modulator 21 converts the bit stream to a signal contained in the 2500 to 2700 Hz band. The FSK modulated signal is coupled through a 2500 to 2700 Hz bandpass filter 22 to combining circuit 19 where it is combined with the compressed analog signal. The combined signal is then directed to the modulator 2 (FIG. 1) for transmission.

The Y's transmitted in the control channel can take only eight values: 0, 1, 2, 3, 4, 5, 6 or 7. Since $2^3$ is equal to 8, three bits of information is contained in each Y. If Y was transmitted serially, and each Y is represented by three bits, upon reception there is three ways of separating the serial bit stream into the individual Y's, but only one would be correct. To avoid this ambiguity, an extra bit is added to each Y constructing the following code dictionary.

1010
0110
1110
0001
1001
1010
1101
1011

The code 0001 is a uniquely recognizable code because no combination of words in the dictionary can be mistaken for it. That is, there is no way in which the end part of one code word and the beginning part of another can form the uniquely recognizable word. In this way the received serial bit stream can be divided into words correctly. In addition, the bit stream can maintain word integrity even after momentary interruption of the signal. This is why the gain signal is transmitted at 160 bits per second when each syllable requires only 3 bits of information and syllables occur at 40 times per second.

In the expander 10, shown in FIG. 4, the input signal from the demodulator 6 (FIG. 1) is separated into a compressed voice channel by a 300-2500 Hz bandpass filter 23 and a control channel by a 2500-2700 Hz bandpass filter 24. The signal (C) at the output of filter 23 is shown in FIG. 5(a). The output from filter 24 is directed to a FSK demodulator 25 where it is demodulated to obtain a serial bit stream of 160 bits per second which in the decoder 26 is transformed to a 4 bit parallel output word occuring at the rate of 1 word per 25 milliseconds or 1/40 second. If a precise AGC circuit is required to combat fading the AGC control signal can be derived from output of filter 24.

The expander 10 further includes an A-D converter 27, a shift register delay line 28, a shift register 29 and delay circuit 30 which are similar to A-D converter 12, delay line 13, shift register 15 and delay circuit 17 in the compressor 9. The compressed analog signal is sampled and digitized in the A-D converter at a rate P, loaded into the delay line where it is delayed by a full syllabic interval of 25 milliseconds. The output of delay line 28 is coupled into the shift register 29 where it is gain adjusted by shifting the binary number downward under the control of the Y number to produce a gain 1/N, where N = $2^Y$. The shifted binary number is then fed into a D-A converter 31 together with the sign bit from delay circuit 30 where it is transformed into an analog signal. The output from the A-D converter is passed through a 300-2500 Hz bandpass filter 32 to provide the output voice signal (D) shown in FIG. 5(a).

As indicated above, many components of the compressor 9 and expander 10 may be shared in a transceiver. With a simple switching circuit controlled by the talk-receive button on a transceiver, the bandpass filter 11, A-D converter 12, shift register delay line 13, delay circuit 17, shift register 15, D-A converter 16 and bandpass filter 18 in the compressor 9 circuit could also be used in the expander 10 circuit during the receive mode. When the AFC feature is required the centre of the control channel can be located by extracting a frequency reference by means of a costa's loop.

I claim:

1. A voice processing system for radio telephones having an amplitude modulating signal transmitter and receiver, comprising:
   compressor means for adjusting the input voice signal to be transmitted by the transmitter, said compressor means including means for receiving and dividing the input voice signal into sequential syllabic groups of equal length M, means for detecting the peak amplitude of each sequential syllabic group and adjusting the amplitude of the corresponding syllabic group by a gain adjustment determined by the detected peak amplitude, and means for providing a control signal representative of the sequential gain adjustments for transmission with the adjusted voice signal; and expander means for restoring the adjusted voice signal from the transmitted signals received by the receiver, said expander means including means for receiving and dividing the received adjusted voice signal into the sequential syllabic groups of equal length M and means for receiving the control signal and adjusting the amplitude of each sequential syllabic group by a gain adjustment determined by the received control signal, thereby restoring the received adjusted signal to the original input voice signal.

2. A voice processing system as claimed in claim 1 with the signal representative of the gain adjustments being in synchronism with corresponding voice signal syllabic groups.

3. A voice processing system as claimed in claim 2 with the amplitude adjustment in the expander being the reciprocal of the amplitude adjustment in the compressor for corresponding syllabic groups.

4. A voice processing system as claimed in claim 3 with the gain of the compressor amplitude adjusting means being selected from a predetermined number of fixed gains.

5. A voice processing system for radio telephones having an amplitude modulating signal transmitter and receiver comprising:

compressor means for adjusting the input voice signal to be transmitted by the transmitter, said compressor means including analog to digital converter means for sampling the input signal at a predetermined rate P to provide a series of binary numbers digitally representing the input signal, said binary numbers being grouped into sequential syllabic groups each having M consecutive binary numbers in shift register means, means for detecting the largest binary number in each sequential syllabic group and adjusting the binary numbers in each syllabic group by a factor N determined by the largest detected binary number in the corresponding syllabic group, digital to analog converter means for converting the adjusted binary numbers to an adjusted analog voice signal, and means for producing a control signal representing the sequential adjusting factors N for transmission with the adjusted voice signal; and expander means for restoring the adjusted voice signal from the transmitted signals received by the receiver, said expander means including analog to digital converter means for sampling the received adjusted voice signal at the rate P to provide a series of binary numbers grouped into sequential syllabic groups each have M consecutive binary numbers in shift register means, means for receiving the control signal and adjusting the binary numbers in each syllabic group by the corresponding reciprocal factor 1/N for each syllabic group, and digital to analog converter means for converting the adjusted binary number to a voice output signal.

6. A voice processing system as claimed in claim 5 wherein the compressor adjusting means includes means for multiplying the binary numbers by the factor $N = 2^Y$ where $Y = 0$, or 1, or 2, or 3, ..., and wherein the expander adjusting means includes means for multiplying the binary numbers by the factor $1/N = 1/2^Y$.

7. A voice processing system as claimed in claim 6 wherein the compressor multiplying means and the expander multiplying means each include a parallel input M position shift register means for sequentially receiving each of said binary numbers, and means for operating on said shift register means to shift each binary number up or down respectively by Y positions.

8. A voice processing system as claimed in claim 7 wherein the compressor multiplying means further includes means for detecting the largest binary number in a syllabic group to determine Y, Y being equal to the number of "0"s preceeding a "1" in said largest number.

9. A voice processing system as claimed in claim 8 wherein said compressor digital to analog converter means includes low pass filter means for maintaining the adjusted output frequency below a predetermined frequency and said control signal producing means includes a frequency shift keyed modulator controlled by the value of Y and filter means to provide a digital control signal having a frequency greater than said predetermined frequency.

10. A voice processing system as claimed in claim 9 wherein the compressor means further includes means for combining the adjusted compressor output signal of each syllabic group with the corresponding Y control signal for synchronous transmission.

11. A voice processing system as claimed in claim 10 wherein said lowpass filter means consists of a 300–2500 Hz bandwidth filter and said second filter means consists of a 2500–2700 Hz bandwidth filter.

* * * * *